United States Patent
Zhou et al.

(10) Patent No.: US 12,232,379 B2
(45) Date of Patent: Feb. 18, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Kun Zhou, Hubei (CN); Ping Zhong, Hubei (CN); Shaojing Wu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 94 days.

(21) Appl. No.: 17/793,401

(22) PCT Filed: Jun. 29, 2022

(86) PCT No.: PCT/CN2022/102217
§ 371 (c)(1),
(2) Date: Jul. 17, 2022

(87) PCT Pub. No.: WO2023/231114
PCT Pub. Date: Dec. 7, 2023

(65) Prior Publication Data
US 2024/0008323 A1   Jan. 4, 2024

(30) Foreign Application Priority Data
May 31, 2022   (CN) .......................... 202210613480.3

(51) Int. Cl.
*H10K 59/122* (2023.01)
*G06F 3/041* (2006.01)
(Continued)

(52) U.S. Cl.
CPC .......... *H10K 59/131* (2023.02); *G06F 3/0412* (2013.01); *H10K 59/122* (2023.02); *H10K 59/40* (2023.02)

(58) Field of Classification Search
None
See application file for complete search history.

(56) References Cited

U.S. PATENT DOCUMENTS

2018/0061728 A1* 3/2018 Chen .................... H01L 27/1248
2021/0305335 A1* 9/2021 Gao ....................... H10K 59/40

FOREIGN PATENT DOCUMENTS

| CN | 106775173 A | 5/2017 |
| CN | 107783691 A | 3/2018 |

(Continued)

OTHER PUBLICATIONS

International Search Report in International application No. PCT/CN2022/102217, mailed on Dec. 19, 2022.
(Continued)

*Primary Examiner* — Brian M Butcher
(74) *Attorney, Agent, or Firm* — Rivka Friedman

(57) ABSTRACT

The present application provides a display panel and a display device, including a first planarization layer, a second planarization layer, a first pixel definition layer, a second pixel definition layer, a first support column, a second support column, a first dam structure, and a second dam structure. The first dam structure is located in the first dam area, including a first planarization layer, a second planarization layer, a first pixel definition layer and a first support column. The second dam structure is located in the second dam area, including a second planarization layer, the second pixel definition layer and the second support column.

16 Claims, 2 Drawing Sheets

(51) Int. Cl.
*H10K 59/131* (2023.01)
*H10K 59/40* (2023.01)

(56) References Cited

FOREIGN PATENT DOCUMENTS

| | | | |
|---|---|---|---|
| CN | 109713017 | A | 5/2019 |
| CN | 110277506 | A | 9/2019 |
| CN | 110611047 | A | 12/2019 |
| CN | 111158517 | A | 5/2020 |
| CN | 111613628 | A | 9/2020 |
| CN | 112018159 | A | 12/2020 |
| CN | 112164715 | A | 1/2021 |
| CN | 112349867 | A | 2/2021 |
| KR | 20180119153 | A | 11/2018 |
| KR | 20210086249 | A | 7/2021 |
| WO | 2022062726 | A1 | 3/2022 |

OTHER PUBLICATIONS

Written Opinion of the International Search Authority in International application No. PCT/CN2022/102217, mailed on Dec. 19, 2022.
Chinese Office Action issued in corresponding Chinese Patent Application No. 202210613480.3 dated Jan. 18, 2023, pp. 1-6.

\* cited by examiner

DISPLAY PANEL AND DISPLAY DEVICE

FIELD OF INVENTION

The invention relates to the field of display technology, and particularly to a display panel and a display device.

BACKGROUND

Active-matrix organic light-emitting diode (AMOLED) display panels have gradually become a new generation of display technology due to their high contrast ratio, wide color gamut, and low power consumption. Compared with traditional liquid crystal displays (LCDs), OLED display panels are easy to be flexible, which is a key technology for wearable and foldable products.

In the OLED technology, a dam is provided in a non-display area to block a flow of an organic layer of a packaging layer toward a packaging area, thereby affecting packaging effects. However, a structure of the dam is likely to cause a short circuit of a touch trace at the lowest place of the dam.

Technical Solution

A purpose of the present application is to provide a display panel and a display device, which aim to gradually increase a height of a dam structure to reduce residual photoresist at the lowest place of the dam structure, thereby reducing problems of short circuit of the touch trace.

In one aspect, the present application provides a display panel, wherein the display panel comprises a first dam area and a second dam area arranged at intervals in a first direction, and the display panel comprises:
  a first planarization layer in the first dam area;
  a second planarization layer covering the first planarization layer and continuously extending between the first dam area and the second dam area;
  a first pixel definition layer located on the second planarization layer and in the first dam area;
  a second pixel definition layer located on the second planarization layer and in the second dam area;
  a first support column covering the first pixel definition layer and located in the first dam area;
  a second support column covering the second pixel definition layer and located in the second dam area;
  a first dam structure located in the first dam area, comprising the first planarization layer, the second planarization layer, the first pixel definition layer and the first support column; and
  a second dam structure located in the second dam area, comprising the second planarization layer, the second pixel defining layer and the second support column.

In some embodiments, the second pixel definition layer has an exposed platform not covered by the second support column, and the second support column is located between the exposed platform and the first support column.

In some embodiments, a width of the exposed platform in the first direction is 15-18 micrometers.

In some embodiments, the first planarization layer extends from the first dam area to the second dam area, and the second dam structure further comprises the first planarization layer.

In some embodiments, the first planarization layer extends from the first dam area to a place between the first dam area and the second dam area.

In some embodiments, a distance between the first planarization layer and the second support column in the first direction is 7-10 micrometers.

In some embodiments, the display panel further comprises:
  a shallow trench structure located between the first dam area and the second dam area, wherein the shallow trench structure comprises the first planarization layer and the second planarization layer.

In some embodiments, the display panel further comprises a packaging layer covering the first dam structure and the second dam structure, and the packaging layer comprises:
  a first inorganic layer;
  a second inorganic layer on the first inorganic layer; and
  an organic layer between the first inorganic layer and the second inorganic layer;
  wherein the first inorganic layer and the second inorganic layer extend continuously in the first direction, and the organic layer is located on a side of the first dam area away from the second dam area.

In some embodiments, the display panel further comprises:
  a touch layer covers the packaging layer and comprises a dielectric layer and a touch trace located on the dielectric layer.

In some embodiments, the display panel further comprises a packaging area located on a side of the second dam area away from the first dam area, and the display panel further comprises:
  a power signal wiring layer located between the first planarization layer and the second planarization layer, extending to the packaging area in the first direction;
  wherein the first inorganic layer, the second inorganic layer and the touch layer extend to the packaging area in the first direction.

In another aspect, the present application provides a display device, wherein the display device comprises the display panel of any one of the above embodiments.

The present application comprises following advantageous effects.

The present application provides a display panel and a display device,
  a first dam area and a second dam area arranged at intervals in a first direction, and the display panel comprises a first planarization layer, a second planarization layer, a first pixel definition layer, a second pixel definition layer, a first support column, a second support column, a first dam structure, and a second dam structure. The first planarization layer is in the first dam area, and the second planarization layer covers the first planarization layer and continuously extends between the first dam area and the second dam area. The first pixel definition layer is located on the second planarization layer and in the first dam area, and the second pixel definition layer located is on the second planarization layer and in the second dam area. The first support column covers the first pixel definition layer and is located in the first dam area, and the second support column covers the second pixel definition layer and is located in the second dam area. The first dam structure located in the first dam area comprises the first planarization layer, the second planarization layer, the first pixel definition layer and the first support column. The second dam structure located in the second dam area comprises the second planarization layer, the second pixel defining layer and the second support column. Therefore, the second dam structure is a three-layer structure, and the first dam structure is a four-layer structure, and the height of the first dam structure increases gradually from the lowest place of the second dam structure to the first dam structure. Therefore, the level difference that the photoresist for forming the touch trace needs to cross at one time is reduced, and residues of the photoresist at the lowest place of the second dam structure can be reduced, thereby reducing the short circuit problem of the touch trace.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
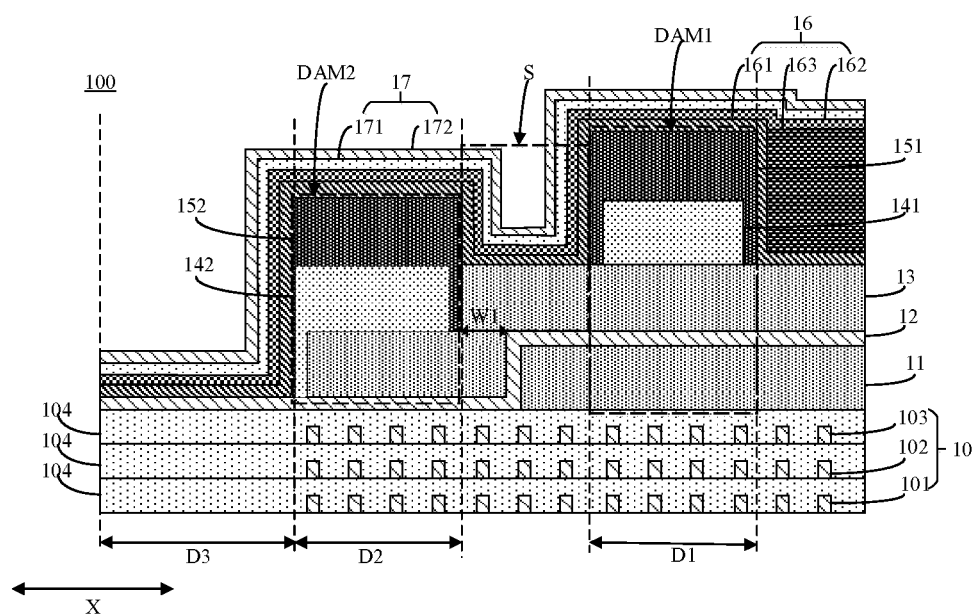
FIG. 1 is a schematic structural diagram of a display panel provided by an embodiment of the present application.

Technical solutions in embodiments of the present application will be clearly and completely described below with reference to the accompanying drawings in the embodiments of the present application. Obviously, the described embodiments are only a part of the embodiments of the present application, but not all of the embodiments. Based on the embodiments in this application, all other embodiments obtained by those skilled in the art without creative efforts shall fall within the protection scope of this application.

In description of the present application, it should be understood that the terms "first" and "second" are only used for description purposes and cannot be interpreted as indicating or implying relative importance or implicitly indicating the number of indicated technical features. Thus, features defined as "first", "second" may expressly or implicitly include one or more of said features. In the description of the present application, "plurality" means two or more, unless otherwise expressly and specifically defined.

In the present application, unless otherwise expressly specified and defined, a first feature "on" or "under" a second feature may include direct contact between the first and second features or may include the first and second features Not directly but through additional features between them. Also, the first feature being "above", "over" and "above" the second feature includes the first feature being directly above and obliquely above the second feature, or simply means that the first feature is level higher than the second feature. The first feature is "below", "below" and "below" the second feature includes the first feature being directly below and diagonally below the second feature, or simply means that the first feature has a lower level than the second feature.

The following disclosures provide many different embodiments or examples for implementing different structures of the present application. To simplify the disclosure of the present application, the components and arrangements of specific examples are described below. Of course, they are only examples and are not intended to limit the application.

Furthermore, this application may repeat reference numerals and/or reference letters in different instances for the purpose of simplicity and clarity and does not in itself indicate a relationship between the various embodiments and/or arrangements discussed. In addition, this application provides examples of various specific processes and materials, but one of ordinary skill in the art will recognize the application of other processes and/or the use of other materials.

Please refer to FIG. 1, which is a schematic structural diagram of a display panel 100 provided by an embodiment of the present application. The display panel 100 can be applied to an organic light emitting diode (OLED) display device.

The display panel 100 comprises a first dam area D1 and a second dam area D2 arranged at intervals in a first direction X. The display panel 100 may be formed on a substrate (not shown in the figure), and the first direction X is a direction parallel to the substrate. That is, the first dam area D1 and the second dam area D2 are arranged at intervals along the first direction X, and other areas or other structures may exist therebetween.

In some embodiments, the display panel 100 may further comprise a packaging area D3, and the packaging area D3 is located on a side of the second dam area D2 away from the first dam area D1, that is, in FIG. 1, the left side of the second dam area D2. The packaging area D3 is used to form a package structure. The first dam area D1, the second dam area D2 and the packaging area D3 may all belong to a non-display area of the display panel 100, and the display area (not shown in the figure) of the display panel 100 may be located at a side of the first dam area D1 away from the second dam area D2.

The display panel 100 at least comprises a fan-out circuit layer 10, a first planarization layer 11, a power signal wiring layer 12, a second planarization layer 13, a first pixel definition layer 141, a second pixel definition layer 142, and a first support column 151, a second support column 152, the first dam structure DAM1 and the second dam structure DAM2.

In some embodiments, the fan-out circuit layer 10 may comprises a first circuit layer 101, a second circuit layer 102 and a third circuit layer 103 that are stacked in sequence, and the first circuit layer 101, the second circuit layer 102 and the third circuit layer are insulated from each other by an insulating layer 104. The fan-out circuit layer 10 extends continuously in the first dam area D1, the second dam area D2 and the packaging area D3.

The first planarization layer 11 is located on the first dam area D1 and the fan-out circuit layer 10. In some embodiments, the first planarization layer 11 may only be located in the first dam area D1. In this embodiment, as shown in FIG. 1, the first planarization layer 11 is not only located in the first dam area D1, but also extends from the first dam area D1 toward a place between the first dam area D1 and the second dam areas D2, that is, a left boundary of the first planarization layer 11 is located between the first dam area D1 and the second dam area D2. In one embodiment, a distance W1 between the first planarization layer 11 and the second support column 152 in the first direction X is 7-10 micrometers.

The power signal wiring layer 12 is located on the fan-out circuit layer 10 and covers the first planarization layer 11. Since the first planarization layer 11 does not exist in the second dam area D2, the power signal wiring layer 12 forms a step on the left border side of the first planarization layer 11. It should be noted that the power signal wiring layer 12 extends to the package area D3 in the first direction X, that is, the power signal wiring layer 12 extends continuously in the first dam area D1, the second dam area D2 and the package area D3.

The second planarization layer 13 covers the first planarization layer 11 and extends continuously between the first dam area D1 and the second dam area D2. It can also be said that the second planarization layer 13 is a whole layer, which extends continuously in the first direction X and in the first dam area D1, the second dam area D2, and the area between the first dam area D1 and the second dam D2. Since the first planarization layer 11 does not exist in the second dam area D2, the second planarization layer 13 forms a step at the left boundary of the first planarization layer 11, so that a surface height of the second planarization layer 13 in the first dam area D1 is greater than a surface height in the second dam area D2.

The first pixel definition layer 141 is located on the second planarization layer 13 and in the first dam area D1, the second pixel definition layer 142 is located on the second planarization layer 13 and in the second dam area D2, and the first pixel definition layer 141 and the second pixel definition layer 142 are provided at intervals.

The first support column 151 covers the first pixel definition layer 141 and is located in the first dam area D1, and the second support column 152 covers the second pixel definition layer 142 and is located in the second dam area D2.

The first dam structure DAM1 is located in the first dam area D1 and comprises a first planarization layer 11, a second planarization layer 13, a first pixel definition layer 141 and a first support column 151, and the second dam structure DAM2 is located at the second dam The wall area D2 also includes the second planarization layer 13, the second pixel definition layer 142 and the second support column 152.

The display panel 100 may further comprise a packaging layer 16, and the packaging layer 16 is located on the power signal wiring layer 12 and covers the first dam structure DAM1 and the second dam structure DAM2. That is, the packaging layer 16 is located on the first dam area D1 and the second dam area D2. The packaging layer 16 comprises a first inorganic layer 161, a second inorganic layer 162 and an organic layer 163. The second inorganic layer 162 is located on the first inorganic layer 161, and the organic layer 163 is between the first inorganic layer 163 and the second inorganic layer 162.

The first inorganic layer 161 and the second inorganic layer 162 extend continuously in the first direction X. In some embodiments, the first inorganic layer 161 and the second inorganic layer 162 extends from the first dam area D1 to the packaging area D3 in the first direction X. Since the first inorganic layer 161 and the second inorganic layer 162 in the packaging layer 16 are connected to the power signal wiring layer 12 in the packaging area D3, a packaging structure with better packaging effect can be formed in the packaging area D3.

The organic layer 163 is located on a side of the first dam area D1 away from the second dam area D2, and a surface height of the organic layer 163 is generally less than or equal to a surface height of the first dam structure DAM1, so as to reduce overflows of the organic layer 163 to the left of the first dam structure DAM1 in the process formed by the inkjet printing technology.

The display panel 100 may further comprise a shallow trench structure S, and shallow trench structure S is located between the first dam area D1 and the second dam area D2 and including the first planarization layer 11 and the second planarization layer 13. On the one hand, both the shallow trench structure S and the second dam structure DAM2 comprise the second planarization layer 13, because the thickness of the first planarization layer 11 in the shallow trench structure S is smaller than a sum of the thickness of the second pixel definition layer 142 in the second dam structure DAM2 and the thickness of the second support column 152, so a height of the shallow trench structure S is smaller than a height of the second dam structure DAM2. On the other hand, the first dam structure DAM1 comprise the additional first pixel definition layer 141 and the first support column 151 when that is compared with the shallow trench structure S, so the height of the shallow trench structure S is also smaller than the height of the first dam structure DAM1, so a trench is formed between the first dam structure DAM1 and the dam structures DAM2. When the organic layer 163 overflows to the left of the first dam structure DAM1 during the formation process, the organic layer 163 can stay in the shallow trench structure S to prevent the organic layer 163 from continuing to overflow to the left of the second dam structure DAM2.

The display panel 100 may further comprise a touch layer 17. The touch layer 17 covers the packaging layer 16 and comprises a dielectric layer 171 and a touch trace 172 located on the dielectric layer 171. The touch layer 17 extends from the first dam area D1 to the packaging area D3 in the first direction X. The touch trace 172 is formed by performing a pattern-etching process on a metal layer, and the metal layer in the package area D3 needs to be etched to form the disconnected touch trace 172. In the pattern-etching process, due to the better fluidity of the photoresist, it is easy to flow from a higher height of a structure to a lower height and gather or remain at the lower height.

In the display panel 100 provided by the present application, the second dam structure DAM2 comprises the second planarization layer 13 and the second pixel definition layer 142 and the second support column 152 (a three-layer structure), and the first dam structure DAN1 comprises the first planarization layer 11, the second planarization layer 13, the first pixel definition layer 141 and the first support column 151 (a four-layer structure). A level difference of the second dam structure DAM2 relative to the packaging area D3 is a three-layer structure, and a level difference of the second dam structure DAM2 relative to the first dam structure DAM1 is a one-layer structure (the first planarization layer 11), so the level difference that needs to be crossed by the photoresist for forming the touch trace 172 in the pattern-etching process is gradually increased from a three-layer structure to a four-layer structure, rather than crossing a gap of a four-layer structure at one time. In this way, residues of the photoresist on the package area D3 (or the bottom of the second dam structure DAM2) can be reduced, thereby reducing the short circuit problem of the touch trace 172.

Figure 2:
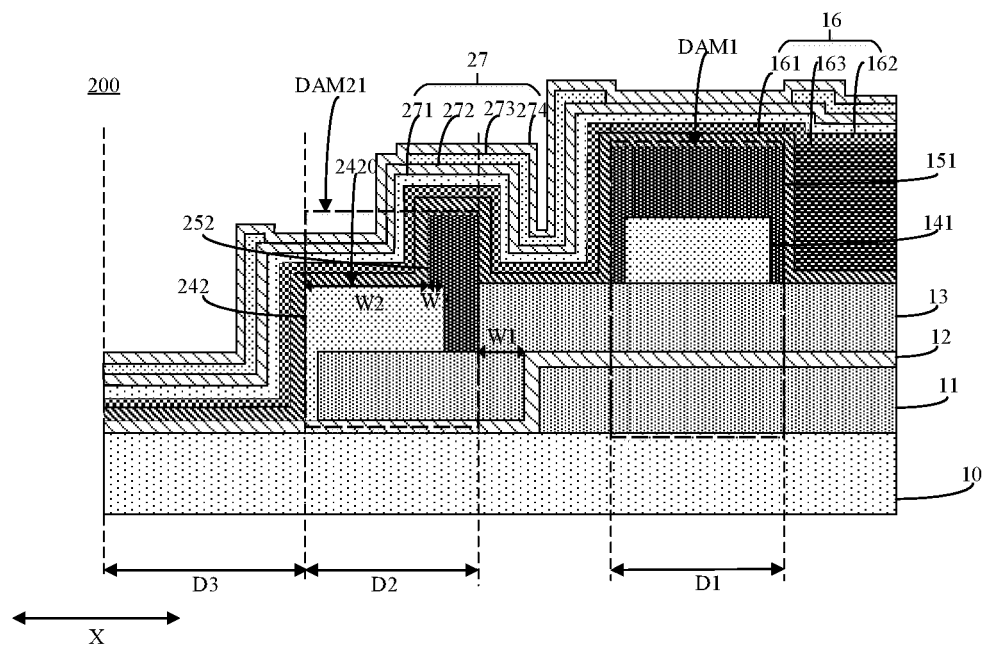
FIG. 2 is a schematic structural diagram of a display panel provided by another embodiment of the present application.

Please refer to FIG. 2, which is a schematic structural diagram of a display panel provided by another embodiment of the present application. For ease of understanding and brief description, same reference numerals are used for the same structures in FIG. 2 as those in FIG. 1, and the same structures will not be described in detail.

The main difference between this embodiment and the above-mentioned embodiment (FIG. 1) lies in the second dam structure DAM21. Specifically, the second dam structure DAM21 comprises a second planarization layer 13, a second pixel definition layer 242 and a second support column 252. The second support column 252 only covers a part of the surface of the right end of the second pixel definition layer 242, so the second pixel definition layer 242 has an exposed platform 2420 not covered by the second support column 252, and the second support column A 252 is located between the exposed platform 2420 and the first support column 151.

In some embodiments, a width W2 of the exposed platform 2420 in the first direction X is 15-18 micrometers. a surface width of the second pixel definition layer 242 may be 20 micrometers, and a width W3 of the surface of the second pixel definition layer 242 covered by the second support column 252 is 2-5 micrometers.

In this embodiment, the touch layer 27 may comprise a first dielectric layer 271, a first touch wiring layer 272, a second dielectric layer 273, and a second touch wiring layer 274 that are stacked in sequence. A via hole is formed in the second dielectric layer 273, and the second touch wiring layer 274 is connected to the first touch wiring layer 272 through the via hole.

In the display panel 200 provided by this embodiment of the present application, the second support column 252 only covers the right end of the second pixel definition layer 242, so that the second pixel definition layer 242 has the exposed platform 2420 not covered by the second support column 252. Therefore, the photoresist can stay above the exposed platform 2420 and will not completely slide down to the bottom of the second dam structure DAM21 when forming the touch layer 27. That is, the residual photoresist at the bottom of the second dam structure DAM21 can be reduced, thereby solving the short circuit problem of the first touch wiring layer 272 and the second touch wiring layer 274 occurs in the package area D3. In addition, a height of the dam structure (including the first dam structure DAM1 and the second dam structure DAM21) gradually increases from bottom to top. Specifically, the height first passes through the level difference (the second planarization layer 13 and the second pixel definition layer 242) of the two-layer structure corresponding to the exposed platform 2420 in the second dam structure DAM21, and then passes through a part of the level difference of the second support column 252, and finally passes through the level difference of the first planarization layer 11. Therefore, the height of the photoresist increases gradually from the packaging area D3 to the first dam area D1, instead of crossing the level difference of the four-layer structure of the first dam structure DAM1 at one time, which can reduce the inclination of the photoresist, and the photoresist can be effectively prevented from gathering at the lowest place (package area D3), and the short circuit problem between the first touch wiring layer 272 and the second touch wiring layer 274 in the packaging area D3 can be effectively solved.

Figure 3:
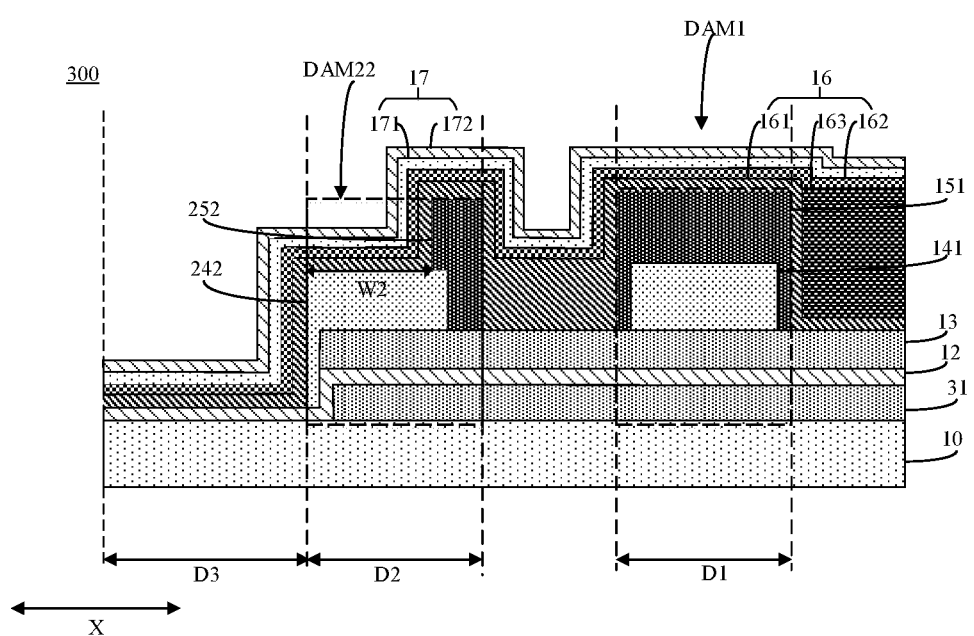
FIG. 3 is a schematic structural diagram of a display panel provided by another embodiment of the present application.

Please refer to FIG. 3, which is a schematic structural diagram of a display panel provided by another embodiment of the present application. For ease of understanding and brief description, the same reference numerals are used for the same structures in FIG. 3 as those in FIGS. 1 and 2, and the same structures will not be described in detail.

The main difference between this embodiment and the above-mentioned embodiment (FIG. 2) is that the first planarization layer 31 is not only located in the first dam area D1, but also extends from the first dam area D1 to the second dam area D2. Therefore, the second dam structure DAM22 comprises the first planarization layer 31, the second planarization layer 13, the second pixel definition layer 242 and the second support column 252. Similar to FIG. 2, in the second dam structure DAM22, the second support column 252 only covers the right end of the second pixel definition layer 242.

In the display panel 300 provided by the embodiment of the present application, the height of the dam structure (including the first dam structure DAM1 and the second dam structure DAM22) gradually increases, and firstly passes through the level difference of the three-layer structure (the first planarization layer 31, the planarization layer 13 and the second pixel definition layer 242), and then pass through a part of the level difference of the second support column 252. Therefore, the height of the photoresist forming the touch wiring layer 172 is also gradually increased, instead of directly crossing the level difference of the four-layer structure, thereby reducing the residual photoresist at the bottom of the second dam structure DAM22 and reducing the short circuit problem of the touch wiring layer 172.

Embodiments of the present application further provide a display device, comprising the display panel in any of the foregoing embodiments. The display device has the same beneficial effects as those of the display panel in any of the above-mentioned embodiments, which will not be repeated here.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, wherein the display panel comprises a first dam area and a second dam area spaced apart from the first dam area in a first direction, and the display panel comprises:
    a first planarization layer in the first dam area;
    a second planarization layer covering the first planarization layer and continuously extending from the first dam area to the second dam area;
    a first pixel definition layer located on the second planarization layer and in the first dam area;
    a second pixel definition layer located on the second planarization layer and in the second dam area;
    a first support column covering the first pixel definition layer and located in the first dam area;
    a second support column covering the second pixel definition layer and located in the second dam area;
    a first dam structure located in the first dam area, comprising the first planarization layer, the second planarization layer, the first pixel definition layer and the first support column; and
    a second dam structure located in the second dam area, comprising the second planarization layer, the second pixel defining layer and the second support column;
    wherein the second pixel definition layer has a platform not covered by the second support column, the second support column is located between the platform and the first support column;
    and a width of the platform in the first direction ranges from 15 micrometers to 18 micrometers.

2. The display panel of claim 1, wherein the first planarization layer extends from the first dam area to the second dam area, and the second dam structure further comprises the first planarization layer.

3. The display panel of claim 1, wherein the first planarization layer extends from the first dam area to a place between the first dam area and the second dam area.

4. The display panel of claim 1, wherein a distance between the first planarization layer and the second support column in the first direction ranges from 7 micrometers to 10 micrometers.

5. The display panel of claim 1, wherein the display panel further comprises:
   a trench structure located between the first dam area and the second dam area, wherein the trench structure comprises the first planarization layer and the second planarization layer.

6. The display panel of claim 1, wherein the display panel further comprises a packaging layer covering the first dam structure and the second dam structure, and the packaging layer comprises:
   a first inorganic layer;
   a second inorganic layer on the first inorganic layer; and
   an organic layer between the first inorganic layer and the second inorganic layer;
   wherein the first inorganic layer and the second inorganic layer extend continuously in the first direction, and the organic layer is located on a side of the first dam area away from the second dam area.

7. The display panel of claim 6, wherein the display panel further comprises:
   a touch layer covering the packaging layer and comprising a dielectric layer and a touch trace located on the dielectric layer.

8. The display panel according to claim 7, wherein the display panel further comprises a packaging area located on a side of the second dam area away from the first dam area, and the display panel further comprises:
   a power signal wiring layer located between the first planarization layer and the second planarization layer, and extending to the packaging area in the first direction;
   wherein each of the first inorganic layer, the second inorganic layer and the touch layer extends to the packaging area in the first direction.

9. A display device, wherein the display device comprises the display panel of claim 1.

10. The display device of claim 9, wherein the first planarization layer extends from the first dam area to the second dam area, and the second dam structure further comprises the first planarization layer.

11. The display device of claim 9, wherein the first planarization layer extends from the first dam area to a place between the first dam area and the second dam area.

12. The display device of claim 9, wherein a distance between the first planarization layer and the second support column in the first direction ranges from 7 micrometers to 10 micrometers.

13. The display device of claim 9, wherein the display panel further comprises:
   a trench structure located between the first dam area and the second dam area, wherein the trench structure comprises the first planarization layer and the second planarization layer.

14. The display device of claim 9, wherein the display panel further comprises a packaging layer covering the first dam structure and the second dam structure, and the packaging layer comprises:
   a first inorganic layer;
   a second inorganic layer on the first inorganic layer; and
   an organic layer between the first inorganic layer and the second inorganic layer;
   wherein the first inorganic layer and the second inorganic layer extend continuously in the first direction, and the organic layer is located on a side of the first dam area away from the second dam area.

15. The display device of claim 14, wherein the display panel further comprises:
   a touch layer covering the packaging layer and comprising a dielectric layer and a touch trace located on the dielectric layer.

16. The display device according to claim 15, wherein the display panel further comprises a packaging area located on a side of the second dam area away from the first dam area, and the display panel further comprises:
   a power signal wiring layer located between the first planarization layer and the second planarization layer, and extending to the packaging area in the first direction;
   wherein each of the first inorganic layer, the second inorganic layer and the touch layer extends to the packaging area in the first direction.

* * * * *